US011238369B2

(12) United States Patent
Demiralp et al.

(10) Patent No.: US 11,238,369 B2
(45) Date of Patent: Feb. 1, 2022

(54) INTERACTIVE VISUALIZATION EVALUATION FOR CLASSIFICATION MODELS

(71) Applicant: International Business Machines Corporation, Armonk, NY (US)

(72) Inventors: Cagatay Demiralp, New York, NY (US); Marco Cavallo, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 658 days.

(21) Appl. No.: 16/148,432

(22) Filed: Oct. 1, 2018

(65) Prior Publication Data

US 2020/0104753 A1    Apr. 2, 2020

(51) Int. Cl.
| | | |
|---|---|---|
| G06N 20/00 | (2019.01) | |
| G06N 7/00 | (2006.01) | |
| G06N 5/04 | (2006.01) | |
| G06F 16/28 | (2019.01) | |
| G06F 30/20 | (2020.01) | |

(52) U.S. Cl.
CPC ........... *G06N 20/00* (2019.01); *G06F 16/285* (2019.01); *G06F 30/20* (2020.01); *G06N 5/04* (2013.01); *G06N 7/005* (2013.01)

(58) Field of Classification Search
CPC .......... G06N 20/00; G06N 7/005; G06N 5/04; G06F 30/20; G06F 16/285
See application file for complete search history.

(56) References Cited

U.S. PATENT DOCUMENTS

| | | | |
|---|---|---|---|
| 2002/0149604 A1 | 10/2002 | Wilkinson | |
| 2004/0243328 A1* | 12/2004 | Rapp | A61B 5/4094 |
| | | | 702/71 |
| 2004/0243593 A1 | 12/2004 | Stolte et al. | |
| 2005/0065955 A1 | 3/2005 | Babikov et al. | |

(Continued)

OTHER PUBLICATIONS

Demiralp et al, invis: Exploring High-Dimensional RNA Sequences from In Vitro Selection, 2013, IEEE.*

(Continued)

*Primary Examiner* — Ann J Lo
*Assistant Examiner* — Fen Christopher Tamulonis
(74) *Attorney, Agent, or Firm* — Scully, Scott, Murphy & Presser, P.C.; Daniel P. Morris

(57) ABSTRACT

Methods and systems of classification model evaluation are described. A processor may generate a classifier track comprising visual indicators representing the set of classifier labels. The classifier labels may be based on output data of a classification model. The processor may generate a label track comprising visual indicators representing a set of observed labels received from a device. The processor may output the classifier track and the label track on a user interface. The processor may receive a request to evaluate the classification model, where the request may indicate a performance metric. The processor may identify a set of operators associated with the performance metric. The processor may execute the identified set of operators on the classifier track and the label track. The processor may generate a performance track indicating the performance metric of the classification model. The processor may output the performance track on the user interface.

17 Claims, 12 Drawing Sheets

(56) References Cited

U.S. PATENT DOCUMENTS

| | | | | |
|---|---|---|---|---|
| 2012/0011113 | A1* | 1/2012 | Cohen | G06F 16/951 |
| | | | | 707/723 |
| 2015/0242761 | A1* | 8/2015 | Amershi | G06K 9/00536 |
| | | | | 706/11 |

OTHER PUBLICATIONS

Talbot et al, EnsembleMatrix: Interactive Visualization to Support Machine Learning with Multiple Classifiers, 2009, ACM.*

Kabra, M., Robie, A., Rivera-Alba, M. et al. JAABA: interactive machine learning for automatic annotation of animal behavior. Nat Methods 10, 64-67 (2013). https://doi.org/10.1038/nmeth.2281 (Year: 2013).*

Kabra 2, M., Robie, A., Rivera-Alba, M. et al. JAABA: interactive machine learning for automatic annotation of animal behavior. Website. [Published 2013] [Retrieved Nov. 2021] http://jaaba.sourceforge.net/ (Year: 2013).*

Lawhern V, Hairston WD, Robbins K (2013) Detect: A MATLAB Toolbox for Event Detection and Identification in Time Series, with Applications to Artifact Detection in EEG Signals. Plos One 8(4): e62944. https://doi.org/10.1371/journal.pone.0062944 (Year: 2013).*

Ren, D., et al., "Squares: Supporting Interactive Performance Analysis for Multiclass Classifiers", IEEE Transactions on Visualization and Computer Graphics, Jan. 2017, pp. 61-70, vol. 23, Issue 1.

Amershi, S., et al., "ModelTracker: Redesigning Performance Analysis Tools for Machine Learning", In Proceedings of the 33rd Annual ACM Conference on Human Factors in Computing Systems, CHI 2015, Apr. 18-23, 2015, pp. 337-346.

Alsallakh, B., et al., "Visual methods for analyzing probabilistic classification data", IEEE Transactions on Visualization and Computer Graphics, 2014, pp. 1703-1712, 20(12).

Cavallo, M., et al., "Track Xplorer: A System for Visual Analysis of Sensor-based Motor Activity Predictions", Computer Graphics Forum, Jun. 2018, 11 pages, vol. 37, No. 3, Grace Period Disclosure.

Rice, J., et al., "Monitoring Parkinson's disease with sensors and analytics to improve clinical trials", https://www.ibm.com/blogs/research/2017/04/monitoring-parkinsons-disease/, Apr. 11, 2017, Printed on Oct. 1, 2018, 4 pages.

* cited by examiner

INTERACTIVE VISUALIZATION EVALUATION FOR CLASSIFICATION MODELS

STATEMENT REGARDING PRIOR DISCLOSURES BY THE INVENTOR OR A JOINT INVENTOR

The following disclosure is submitted under 35. U.S.C. 102(b)(1)(A): M. Cavallo, Ç. Demiralp, "Track Xplorer: A System for Visual Analysis of Sensor-based Motor Activity Predictions", Computer Graphics Forum, Volume 37, Issue 3 (June 2018).

BACKGROUND

The present application relates generally to computers, and computer applications, and more particularly to computer-implemented methods and systems relating to classification systems.

Sensor data collected by sensors are used in a wide range of applications, such as detection of events and activities in a physical environment. In some examples, the sensor data are used to train one or more classification models. Each trained classification model, when executed, may classify new events and/or activities into different categories. In order to develop and train the classification models, an evaluation computer device may be configured to iteratively perform experiments based on outputs from different classifiers and training parameters. In some examples, results of these iterative experiments, such as performance metrics, are expressed as textual display of individual event sequences that have limited granularity and scalability to effectively develop the classification model. Further, such iterative experiments may sometimes be inefficient, time consuming, cumbersome, and may require the evaluation computer device to use a significant amount of processing power by repeatedly performing the same experiment on different classifiers and training parameters.

SUMMARY

In some examples, a method of classification model evaluation is generally described. The method may include receiving, by a processor, output data from a classification model. The output data may comprise a set of probability scores of occurrences of an event within a range of time. The method may further include generating, by the processor, a set of classifier labels based on the output data. The set of classifier labels may be a set of discrete labels representing a portion of the output data. The method may further include receiving, by the processor, a set of observed labels from a device. Each observed label may indicate an observed occurrence of the event within the range of times. The method may further include generating, by the processor, a classifier track comprising a set of visual indicators representing the set of classifier labels. The method may further include generating, by the processor, a label track comprising a set of visual indicators representing the set of observed labels. The method may further include outputting, by the processor, the classifier track and the label track on a user interface. The classifier track and label track may be displayed in a layout that aligns the classifier track and the label track. The method may further include receiving, by the processor, a request for an evaluation of the classification model. The request may indicate a performance metric. The method may further include identifying, by the processor, a set of operators associated with the performance metric. The method may further include executing, by the processor, the identified set of operators on at least one of the classifier track and the label track. The method may further include generating, by the processor, a performance track indicating the performance metric of the classification model. The method may further include outputting, by the processor, the performance track on the user interface to display the performance track, the classifier track, and label track in the layout, such that the performance track may be aligned with the classifier track and the label track.

In some examples, a system of classification model evaluation is generally described. The system may include a memory device and a hardware processor configured to be in communication with each other. The memory device may be configured to store output data from a classification model. The output data may comprise a set of probability scores of occurrences of an event within a range of time. The memory device may be further configured to store a set of observed labels. Each observed label may indicate an observed occurrence of the event within the range of times. The hardware processor may be configured to obtain the output data from the memory device. The hardware processor may be further configured to generate a set of classifier labels based on the output data. The set of classifier labels may be a set of discrete labels representing a portion of the output data. The hardware processor may be further configured to obtain the set of observed labels from the memory device. The hardware processor may be further configured to generate a classifier track comprising a set of visual indicators representing the set of classifier labels. The hardware processor may be further configured to generate a label track comprising a set of visual indicators representing the set of observed labels. The hardware processor may be further configured to output the classifier track and the label track on a user interface. The classifier track and label track may be displayed in a layout that aligns the classifier track and the label track. The hardware processor may be further configured to receive a request for an evaluation of the classification model. The request may indicate a performance metric. The hardware processor may be further configured to identify a set of operators associated with the performance metric. The hardware processor may be further configured to execute the identified set of operators on at least one of the classifier track and the label track. The hardware processor may be further configured to generate a performance track indicating the performance metric of the classification model. The hardware processor may be further configured to output the performance track on the user interface to display the performance track, the classifier track, and label track in the layout, such that the performance track may be aligned with the classifier track and the label track.

In some examples, a computer program product of classification model evaluation is generally described. The computer program product may include a computer readable storage medium having program instructions embodied therewith. The program instructions may be executable by a processing element of a device to cause the device to perform one or more methods described herein.

Further features as well as the structure and operation of various embodiments are described in detail below with reference to the accompanying drawings. In the drawings, like reference numbers indicate identical or functionally similar elements.

DETAILED DESCRIPTION

In some examples, existing evaluation systems of classification models are limited to non-temporal data classifications, or are limited in terms of functionality and scope when dealing with temporal data classification (e.g., using numerical or textual methods to analyze results of the classification models). A development cycle of predictive classification models based on sensor data is particularly challenging due to the temporal nature of the sensor data, which causes difficulty in evaluating, comparing, and reasoning of the sensor data. A system in accordance with the present disclosure (e.g., a system 100 shown in FIG. 1), in some embodiments, provides an interactive system that enables visual, quantitative analysis, and comparison of results from multiple sensor data classification models and/or ground-truth labels, which improves computer systems that are configured to develop and evaluate predictive classification models, such as by reducing the amount of experiments to be performed by the computer systems, thus reducing processing power. The system 100 also enhances development and debugging experience by data scientists utilizing the computer systems to develop and evaluate the predictive classification models.

To be described in more detail below, the system 100 provides a tool to visually represent both results from classification models and ground-truth labels (e.g., observed results), and performs logical operations on the visual representations to filter, aggregate, compose, and compare the visual representations, in order to facilitate a performance analysis of one or more classification models. The system 100 provides a prompt identification of mispredictions at particular times, a tool to visually compare the performance of multiple classification models or different versions of the same classification model, an estimation of a joint performance of multiple classification models, exclusion of sensor data corresponding to missing or inaccurate observed labels from a validation process, generation of new labels to be used for training or validation, visualization of mispredictions that may affect a set of specific performance metrics, coordination of the visualization of classification results and ground-truth labels, and/or other features. Some example performance metrics of predictive classification models that may be evaluated by the system 100 include accuracy, precision, and recall scores, and/or other performance metrics.

Figure 1:
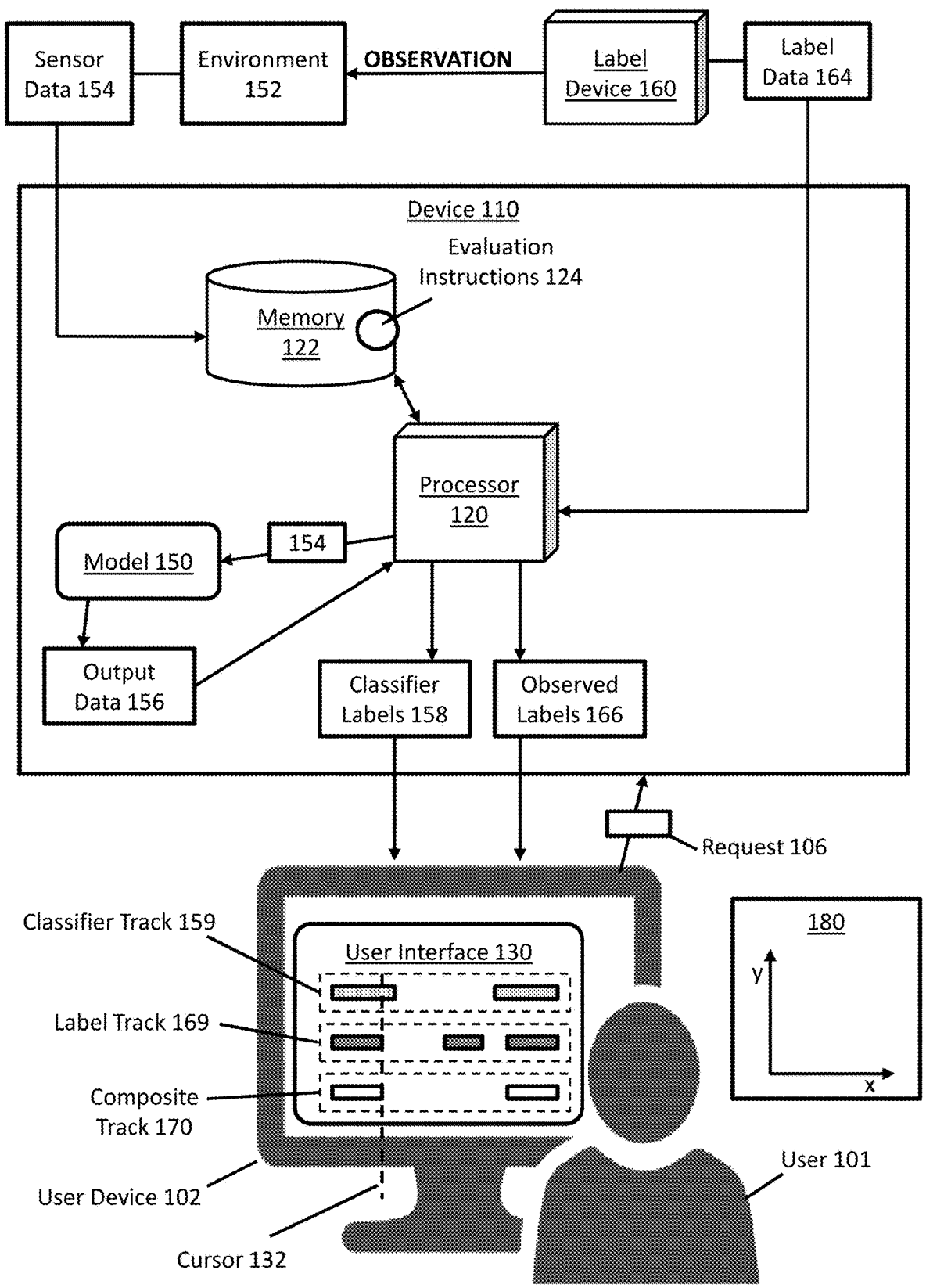
FIG. 1 illustrates an example computer system, in one embodiment, that can be utilized to implement interactive visualization evaluation for classification models.

FIG. 1 illustrates an example computer system, in one embodiment, that can be utilized to implement interactive visualization evaluation for classification models, arranged in accordance with at least some embodiments described herein. In some examples, the system 100 is implemented with a computer device 110. The device 110 may be configured to be in communication with a label device 160, where the label device 160 may be a computer device. The device 110 may include a processor 120 and a memory 122 configured to be in communication with each other. In some examples, the processor 120 may be a central processing unit of the device 110, and may be configured to control operations of the memory 122 and/or other components of the device 110. In some examples, the system 100 and/or device 110 may include additional hardware components, such as programmable logic devices, microcontrollers, memory devices, and/or other hardware components, that may be configured to perform respective tasks of the methods described in the present disclosure. In some examples, the processor 120 may be configured to execute software modules that include instructions to perform each respective task of the methods described in the present disclosure.

The memory 122 is configured to selectively store instructions executable by the processor 120. For example, in one embodiment, the memory 122 may store a set of model evaluation instructions 124 ("instructions 124"), where the model evaluation instructions 124 include instructions, such as executable code, related to logic operations, graphics processing, machine learning algorithms, and/or other algorithms or techniques, which may implement the system 100. The processor 120 is configured to execute one or more portions of the instructions 124 in order to facilitate implementation of the system 100. For example, the processor 120 is configured to execute the instructions 124 to produce a user interface 130, output the user interface 130 on a display of a user device 102, populate and/or update the user interface 130 with various visual indicators, which will be described in more detail below. In some examples, the instructions 124 may be packaged as a standalone application that may be installed on the computer device implementing the system 100, such that the instructions 124 may be executed by the processor 120 to implement the system 100. In some examples, the instructions 124 may be stored in a programmable hardware component that may be embedded as part of the processor 120.

In an example, an environment 152 (e.g., a physical location) may include one or more sensors configured to detect signals generated by activities within the environment 152. For example, the environment 152 may include one or more objects or entities, such as people, attached to the one or more sensors (e.g., wearable sensors), such that the one or more sensors may collect sensor data 154 relating to movements of the one or more objects or entities within the environment 152. The one or more sensors in the environment 152 may send the sensor data 154 to the device 110 to be stored in the memory 122. In some examples, the sensor data 154 may be sensor data collected by the one or more sensors within a range of time, and each piece of sensor data may correspond to a timestamp. The processor 120 is configured to develop a model 150 using the sensor data 154 stored in the memory 122, where the model 150 may be a predictive classification model. The model 150 may be utilized to classify different pieces of sensor data 154 into one or more categories of events and/or activities, classifying motor activity patterns into different probability scores for particular motions such as moving or stationary. In some examples, the model 150 may be a pre-developed model, or a model that was developed prior to the device 110 receiving the sensor data 154. The processor 120 may be configured to train or refine the pre-developed model using the sensor data 154.

The system 100 may be implemented based on input data from environments (e.g., environment 152), which 1) may be characterized by timestamps, 2) may include events of different nature that have respective durations over time, and/or 3) may be generated or recorded as a video in order to obtain ground-truth labels. Some examples of the environment 152 may include events associated with industrial processes, weather forecasts, and/or finance, economic, and/or social phenomena. For example, the environment 152 may be an environment where sensors such as IoT (Internet of Things) sensors (e.g., smart objects available in a house, building, and/or office) and/or remote or wearable sensors (e.g., ECG data, Fitbit), may be disposed to detect time series data.

In an example, the processor 120 may execute the model 150 on the sensor data 154 stored in the memory 122 to generate a set of output data 156 representing a set of probability scores for activities or events within a range of time in the environment 152. The output data 156 may include temporal data (e.g., time-based data), such as a continuous function of a set of probability scores that varies with time, indicating probabilities of an object moving in the environment 152 at different times within the range of time.

The label device 160 may be configured to generate label data 164 based on an observation of the environment 152. The observation, in one embodiment, may be performed by one or more users of the label device 160. In an example, the one or more users of the label device 160 may visually observe the activities of the one or more objects in the environment 152 within the range of time. In another example, the one or more users of the label device 160 may observe a file including texts, numbers, symbols, images, videos, and/or other data or information, relating to the activities of the one or more objects in the environment 152 within the range of time. For example, the one or more users of the label device 160 may view a video showing the activities of the one or more objects in the environment 152 within the range of time. The one or more users of the label device 160 may use the label device 160 to label activities at different times within the range of time in order to generate the label data 164, such as inputting a value of one when an object is moving and inputting a value of zero when an object is stationary. In another example, the label device 160 may be configured to execute instructions and/or applications to automatically perform observations on the one or more objects in the environment 152, such as executing motion detection algorithms on a video to detect whether each object in the environment 152 is moving or stationary within the range of time. The label data 164 may be temporal data, such as a discrete set of observed labels 166, indicating whether the one or more objects in the video are moving or stationary at different times. The observed labels 166 are based on the observations by the one or more users of the label device 160, and/or based on observations performed by the label device 160 using various instructions and/or applications. The observed labels 166 are used as ground-truth labels in the analysis and evaluations of the model 150.

In an example shown in FIG. 1, a user 101 may operate the user device 102 to input a request 106 to the device 110, where the request 106 is a request to evaluate a performance of the model 150. The processor 120 may execute the instructions 124 to perform the methods described in the present disclosure to evaluate the model 150 based on the output data 156 and the label data 164. The processor 120, in response to receiving the request 106 from the user device 102, may transform the output data 156 into a set of classifier labels 158. In examples where the output data 156 is a continuous function of probability scores, the processor 120 may transform the output data 156 into a set of discrete probability scores corresponding to discrete times (further described below), where the set of discrete probability scores is the set of classifier labels 158. In some examples, the transformation of the output data 156 into the set of classifier labels 158 may be based on the label data 164 or observed labels 166. For example, if a time interval between each pair of consecutive observed labels 166 is T, then the processor 120 may sample the continuous function of probability scores (output data 156) at time interval T to generate the classifier labels 158. In some examples, the transformation of the output data 156 may be based on a probability threshold defined by the instructions 124 or the user 101 (as part of the request 106). For example, if the threshold is 50%, then the processor 120 may sample the probability scores from the output data 156 with scores that are 50% or above, at time interval T, to produce the classifier labels 158.

Upon producing the classifier labels 158, the processor 120 may produce a classifier track 159, where the classifier track 159 is an array of visual indicators representing the classifier labels 158. Each visual indicator among the classifier track 159 may be a group of pixels displayed as a column, a box or block, a line, and/or other shapes. The processor 120 may also produce a label track 169, where the label track 169 is an array of visual indicators representing the observed labels 166 of label data 164. Each visual indicator among the label track may be a group of pixels displayed as a column, a box, a line, and/or other shapes. Details of the classifier track 159 and the label track 169 will be described in more detail below.

The processor 120 may populate the user interface 130 with the classifier track 159 and the label track 169, such as by displaying the classifier track 159 and the label track 169 at particular portions or display locations of the user interface 130 defined by the instructions 124. The classifier track 159 and the label track 169, when displayed in the user interface 130, may be arranged in a layout where comparisons of the classifier track 159 and the label track 169, with respect to time, may be observable by the user 101. For example, the classifier track 159 and the label track 169 may be aligned vertically, in a y-direction of a coordinate system 180, and where the x-direction of the coordinate system 180 may represent time. By aligning different tracks vertically within the user interface 130, the user 101 may compare the displayed tracks with respect to time. For example, the user 101 may use various input devices of the user device 102 (e.g., keyboard, mouse, or other input devices) to move a cursor 132 in the user interface 130 horizontally, or in the x-direction. A position of the cursor 132 in the user interface 130, with respect to the displayed tracks, may provide indications of whether labels based on a classification model matches ground-truth labels. Thus, the system 100 provides an improvement to a user interface that may be utilized to evaluate classification systems by simultaneously displaying visual indicators (e.g., tracks) of classification results and ground-truth labels. The user 101 may use the improved user interface 130, along with various associated tools (e.g., cursor 132), to analyze the visual indicators and determine a course of action regarding the classification model that is being evaluated, without utilizing the device 110 and/or user device 102 to perform relatively complex computations to compare classification model outputs with ground-truth labels. The user 101 may use the user device 102 to view the classifier track 159 and the label track 169 displayed on the user interface 130, without a need to navigate and/or flip through different pages, application windows, files, and/or other types of interfaces. As will be described in more detail below, the device 110 may receive requests (e.g., request 106) from the user 101 to perform various types of operations on the displayed classifier track 159 and the label track 169. The processor 120 may perform the requested operations on the displayed classifier track 159 and the label track 169 to generate one or more composite tracks 170 (described below), where each composite track 170 may be used by the processor 120 to determine one or more performance metrics of the model 150.

Figure 2:
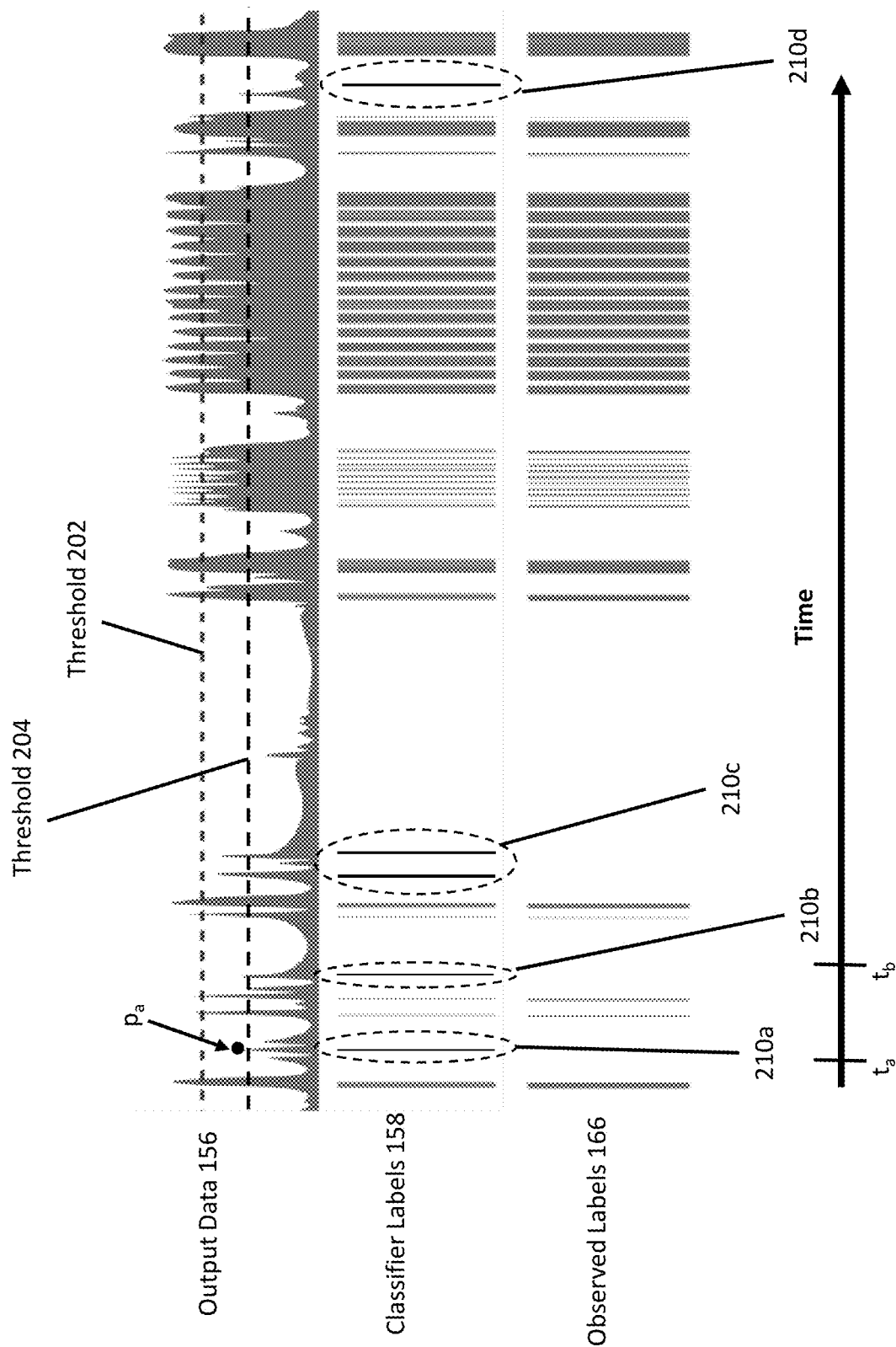
FIG. 2 illustrates example visual indicators, in one embodiment, related to an implementation of interactive visualization evaluation for classification models.

FIG. 2 illustrates example visual indicators, in one embodiment, related to an implementation of interactive visualization evaluation for classification models, arranged in accordance with at least some embodiments presented herein. FIG. 2 may include components that are labeled identically to components of FIG. 1, which will not be described again for the purposes of clarity. The description of FIG. 2 may reference at least some of the components of FIG. 1.

In an example shown in FIG. 2, the output data 156 is a continuous set of probability scores that varies with time. The transformation of the output data 156 into the classifier labels 158 may be based on a threshold 202. The threshold 202 may be a threshold defined by the user 101 and/or the instructions 124. The threshold 202 may impose a bound on the set of probability scores among the output data 156, such that a portion of the output data 156 may be sampled by the processor 120 to generate the classifier labels 158. In an example, if threshold 202 is 85%, then probability scores of 85% or above among the output data 156 will be sampled and used to generate the classifier labels 158. In the example shown in FIG. 2, when threshold 202 is 85%, probability scores of 85% or above are transformed into the set of classifier labels 158 (excluding labels 210a, 210b, 210c, 210d in FIG. 2). If the threshold 202 is adjusted to, for example, 65% (threshold 204), then probability scores of 65% or above among the output data 156 will be sampled and used to generated a different set of classifier labels, such as a set of classifier labels including classifier labels 158 and classifier labels 210.

Each visual indicator representing one or more classifier labels 158 among the classifier track 159 may be displayed with different visual attributes for different values of probability scores indicated by the output data 156. The visual attributes may include visual representation of different pixel values, intensity, brightness, opacity, shade, dash, weight, and/or other visual attributes. For example, a classifier label $C_1$ may be sampled from a probability score of 85% and a classifier label $C_2$ may be sampled from a probability score of 65%. Thus, an intensity of the visual indicator for $C_1$ may be higher than an intensity of the visual indicator $C_2$. The instructions 124 may indicate different levels of visual attributes for the visual indicators representing the classifier labels 158. For example, the intensities of the visual indicators among the classifier track 159 may vary for every probability score of 5% (e.g., 60-65% is displayed with a first intensity, and 65-70% is displayed with a second intensity different from the first intensity). In some examples, the different levels of visual attributes may be based on the threshold being used to sample the output data 156. For example, if the threshold is set to 85%, meaning only probability scores of 85% to 100% are sampled, then the intensities of the visual indicators among the classifier track 159 may vary for every probability score of 3%. If the threshold is adjusted lower, for example, to 50%, meaning probability scores of 50% to 100% are sampled, then the intensities of the visual indicators among the classifier track 159 may vary for every probability score of 10%.

In an example, since the observed labels 166 of the label data 164 are binary (e.g., moving or stationary), the visual indicators among the label track 169 may be displayed as either visible or invisible, where visible indicators are of the same visual attribute such as the same pixel value, shade, opacity, and/or other visual attributes.

In the example shown in FIG. 2, the classifier labels 158 generated based on threshold 202 appear to be more similar to the observed labels 166 when compared to the classifier labels (classifier labels 158 and classifier labels 210a, 210b, 210c, 210d) generated based on the threshold 204. In other words, if observed labels 166 are subtracted from classifier labels 158, the result may be substantially zero, but if observed labels 166 are subtracted from classifier labels including both classifier labels 158, 210, the classifier labels 210 remains. There results may be used by the processor 120 to determine one or more performance metrics of the model 150, and the results may indicate presence of misclassifications corresponding to classifier labels 210 when the model 150 is evaluated at threshold 204. In other words, even though a piece of output data $p_a$ at a particular time $t_a$ (corresponding to label 210a), is "65%" or above, which indicates that there is at least a 65% chance of an event occurrence, the model 150 has misclassified the sensor data with timestamp of $t_a$ because the observed labels 166 indicate that no events occurred at the time $t_a$.

Figure 3:
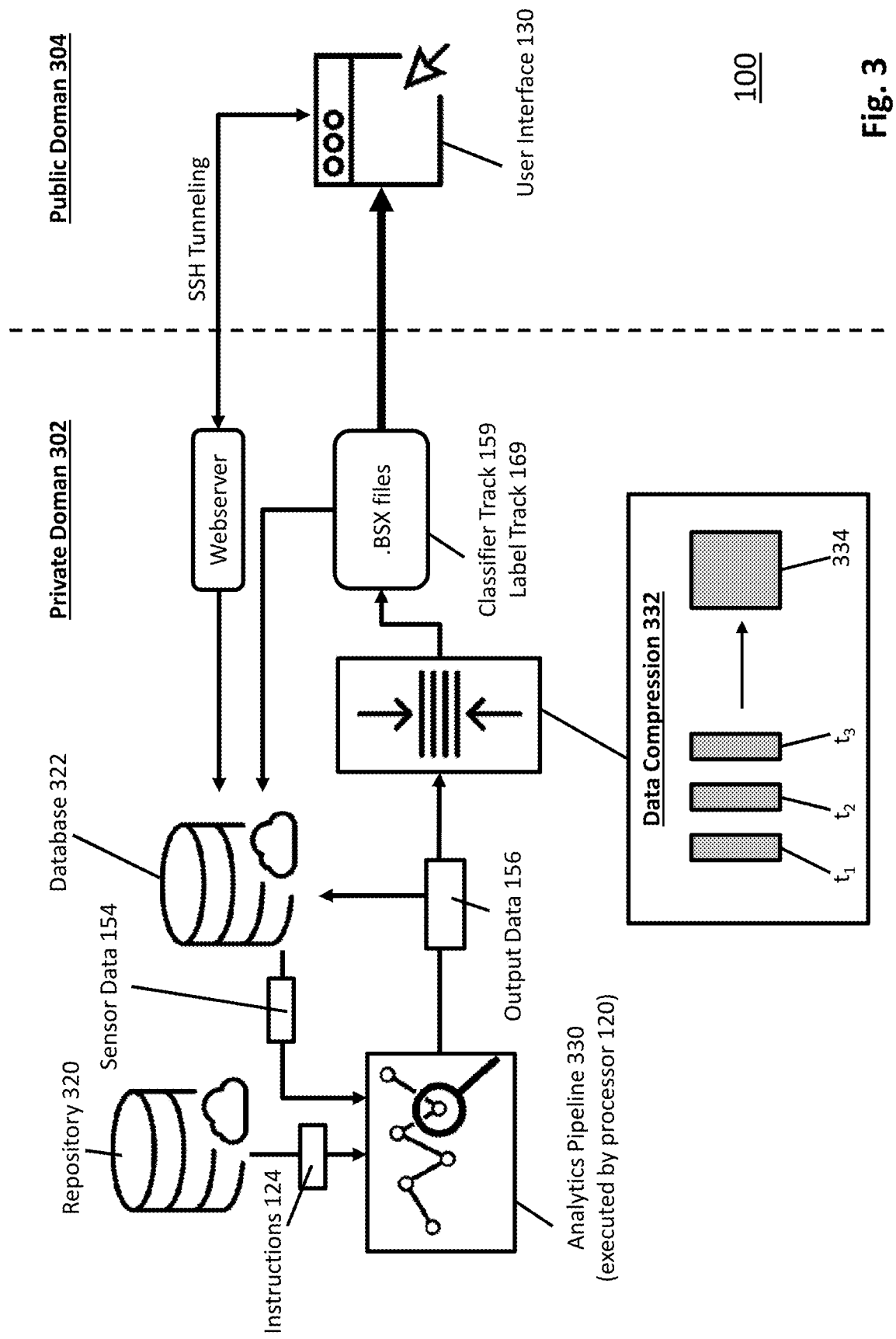
FIG. 3 illustrates the example system of FIG. 1, in one embodiment, with additional details relating to interactive visualization evaluation for classification models.

FIG. 3 illustrates the example system of FIG. 1, in one embodiment, with additional details relating to interactive visualization evaluation for classification models, arranged in accordance with at least some embodiments presented herein. FIG. 3 may include components that are labeled identically to components of FIGS. 1-2, which will not be described again for the purposes of clarity. The description of FIG. 3 may reference at least some of the components of FIGS. 1-2.

In an example illustrated in FIG. 3, the instructions 124 may be stored in a repository 320 and sensor data 154 may be stored in a database 322 in a private domain 302. In some examples, the repository 320 and the database 322 may each be a portion of the memory 122. In some examples, the repository 320 and the database 322 may each be a component of a cloud computing platform. The processor 120 may obtain at least a portion of the instructions 124, such as executable code and metadata, from the repository 320, and may obtain the sensor data 154 from the database 322. In the example of FIG. 3, one or more models including the model 150 may be modularized in an analytics pipeline 330. The processor 120 may execute the analytics pipeline 330, which may include one or more models, according to the obtained portions of the instructions 124, on the obtained sensor data 154 to automatically generate classification results from the one or more models (including the output data 156 from the model 150). The processor 120 may perform data compression 332 on the output data 156 to merge similar predictions among the classification results based on time, where the merged data, or compressed data, may be stored in a format that can be opened in the user interface 130 in the public domain 304, such as JSON-based files (.BSX files).

The merge of the similar predictions among the classification results includes merging prediction results adjacent to each other in time and meeting specific similarity criteria, such that the merged results may be presented as a single prediction. In some examples, the merging is part of the transformation of the output data 156 into output labels 158, and the merging allows the processor 120 to group similar prediction results (e.g., probability scores) in order to output similar classifier labels 158 with the same visual attribute when the classifier track 159 is displayed in the user interface 130. For example, using an example shown in FIG. 2, probability scores at consecutive times $t_1$, $t_2$, $t_3$ may be 85%, 86%, 85%, respectively, and the processor 120 may merge the probability scores at $t_1$, $t_2$, $t_3$, into one group such that corresponding classifier labels may be displayed as a box 334 of the same visual attribute, instead of three different relatively narrow boxes of the same visual attribute. The data compression 332 may facilitate various types of operators that can be executed on the classifier track 159 and the label track 169, which will be described in more detail below. Also, by merging similar predictions, the processor 120 may perform operators (described below) on blocks of labels instead of individual pieces of labels, thus improving an efficiency of the system 100.

Upon the data compression 332, the processor 120 may distribute the classifier track 159 and the label track 169 to the user device 102 through a secure channel. The user 101 may use the user device 102 to view the classifier track 159 and the label track 169 on the user interface 130. The user 101 may use the use device 102 to submit any subsequent request, such as a request to aggregate or combine the classifier track 159 and the label track 169, to the device 110 through a web server and using Secure Shell (SSH) tunneling.

Figure 4:
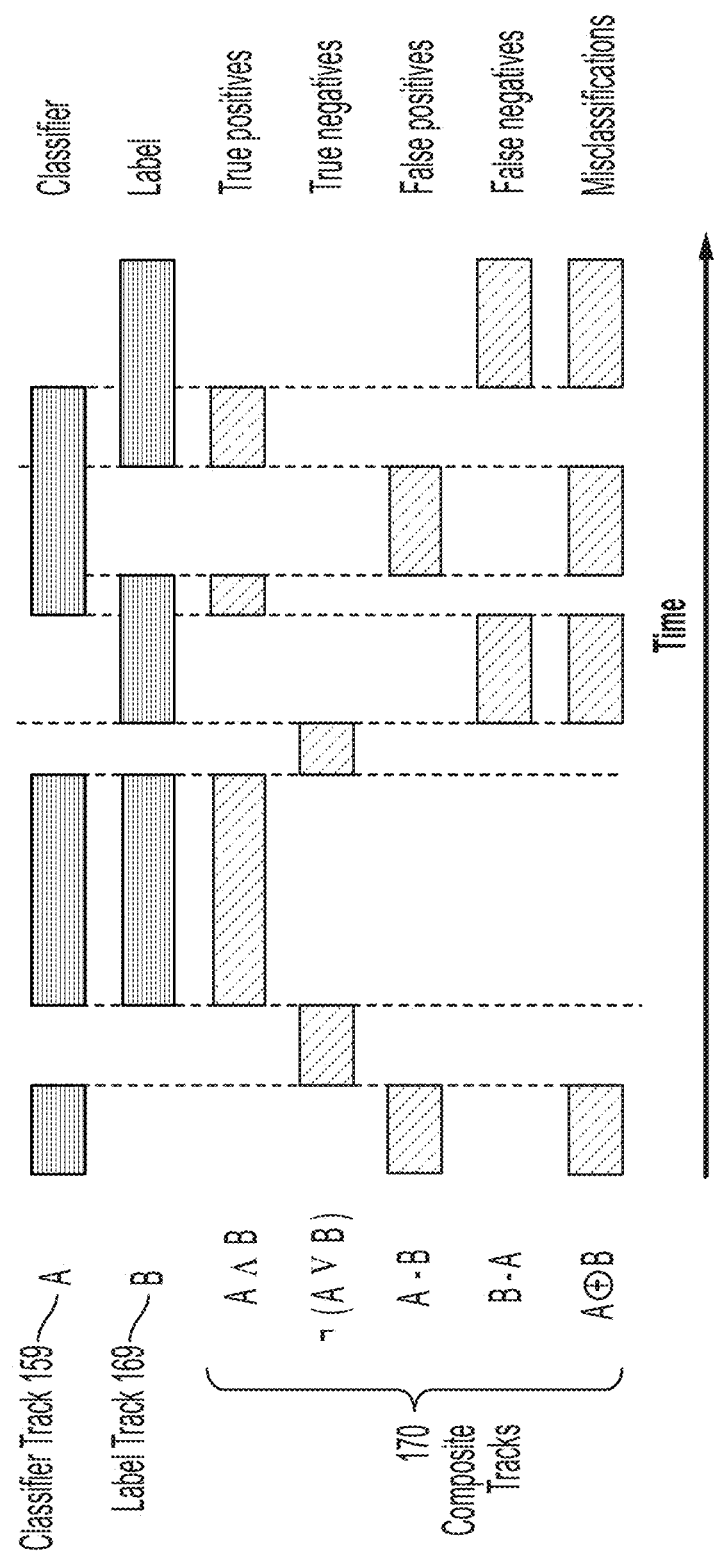
FIG. 4 illustrates example operators, in one embodiment, related to an implementation of interactive visualization evaluation for classification models.

FIG. 4 illustrates example operators, in one embodiment, related to an implementation of interactive visualization evaluation for classification models, arranged in accordance with at least some embodiments presented herein. FIG. 4 may include components that are labeled identically to components of FIGS. 1-3, which will not be described again for the purposes of clarity. The description of FIG. 4 may reference at least some of the components of FIGS. 1-3.

In an example, a track (e.g., classifier track 159 or label track 169) may represent a sequence of non-overlapping events over time, such as motor activity predictions or ground-truth labels. Each track may be displayed and represented as a discrete sequence of blocks on the user interface 130. The processor 120 may be configured to perform one or more algebraic and/or logic operators on two or more tracks, such that new tracks may be generated as a result of the operations. In an example shown in FIG. 4, the classifier track 159 is represented as track A and the label track 169 is represented as track B. Some sample operators that may be performed on the tracks A and B are:

Union operator: A∪B or A\/B. The processor 120 may perform the union operator on track A and track B to generate a composite track 170 that includes instances (labels) from tracks A and B. The composite track 170 generated based on the union operator indicates a combination of the classifier labels 158 and the observed labels 166.

Negation on the Union operator: ⌐(A∪B) or ⌐(A\/B). The processor 120 may perform a negation on the union operator on track A and track B to generate a composite track 170 that indicates a set of true negative labels.

Intersection operator: A∩B or A/\B. The processor 120 may perform the intersection operator on track A and track B to generate a composite track 170 that includes instances present in both A and B. The composite track 170 generated based on the intersection operator indicates a set of true positive labels, or labels corresponding to events that were correctly predicted by the model 150.

Difference operator: A−B or B−A. The processor 120 may subtract track B from track A to remove instances in track B from track A to generate a composite track 170 indicating a set of false positive labels, or labels that correspond to classifications that do not match any ground truth label. The processor 120 may also subtract track A from track B to remove instances in track A from track B to generate a composite track 170 indicating a set of false negative labels, or labels that correspond to events that were not identified by the predictive classification model 150 (false negatives).

Exclusive OR (XOR) operator: A⊕B. The processor 120 may perform the XOR operator to extract instances that are present in track A or track B, but not instances that are present in both tracks A and B, to generate a composite track 170 indicating misclassified labels.

Tilde operator: A~B. The processor 120 may perform the tilde operator to extract instances of track A that temporally match with instances of track B within a time window (further described below).

Negation operator: ¬A. The processor 120 may perform the negation operator to create instances that are missing, or empty, in track A.

Other operators, such as logical operators OR or AND, may also be performed on the classifier tracks and/or label tracks.

By performing one or more operators on the classifier track 159 and/or the label track 169 displayed in the user interface 130, the system 100 may generate one or more composite tracks 170 indicating various performance metrics, errors, mispredictions in time, associated with the outputs from model 150 (output data 156). In some example applications, analysis on either one of the classifier track 159 or the label track 169 may be sufficient (e.g., performing negation operator on the classifier track 159 to identify missing predictions). In other example applications, analysis on a combination of the classifier track 159 and the label track 169 may provide a number of possible analysis on the performance of the model 150, which will be further described below.

In an example, the user 101 may send request 106 to the device 110 to analyze all moments in which an object is stationary in environment 152 within a range of time. The processor 120 may perform the union operator on a plurality of classifier tracks, such as classifier tracks representing "sitting", and "standing", to generate a composite track 170 indicating the times in which the object is stationary. Thus, the system 100 provides a visual tool to combine results from different classification models for various analysis, without the need to analyze textual or numerical outputs from each and every classification model. As result of performing operators on the visual tracks displayed in the user interface 130, the processing power used by the device 110 may be reduced from outputting individual set of outputs from different classification models and processing different computations to combine the outputs. Further, the system 100 allows users, such as data scientists operating the device 110, to combine the visual tracks to validate complex hypotheses regarding the classification process by the model 150. For example, by visually displaying the label track 169 associated with the observed labels 166, the system 100 allows identification of misclassified events in a relatively straightforward manner when compared to other applications requiring execution of complex code and instructions on large amounts of textual or numerical data.

Figure 5:
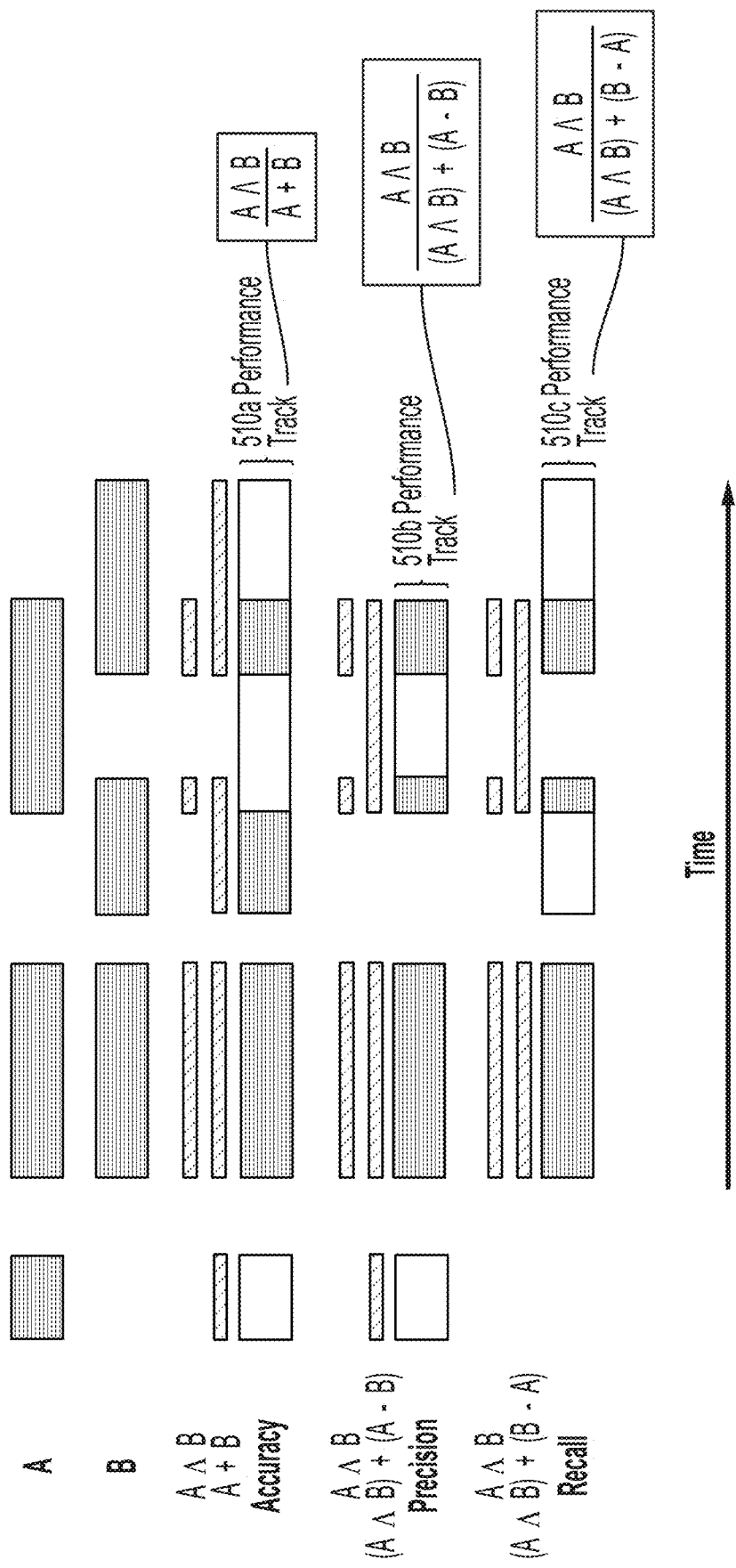
FIG. 5 illustrates example visual indicators, in one embodiment, related to an implementation of interactive visualization evaluation for classification models.

FIG. 5 illustrates example visual indicators, in one embodiment, related to an implementation of interactive visualization evaluation for classification models, arranged in accordance with at least some embodiments presented herein. FIG. 5 may include components that are labeled identically to components of FIGS. 1-4, which will not be described again for the purposes of clarity. The description of FIG. 5 may reference at least some of the components of FIGS. 1-4.

The system 100 may provide performance metrics computed through the at least some of the operators described above with respect to FIG. 4. For example, the processor 120 may perform one or more of the operators, and the results from different combinations of the performed operators may facilitate a determination of one or more performance metrics, such as an accuracy, a precision, recall scores, and/or other performance metrics, of the model 150. For example, the processor 120 may perform a first operator and a second operator on the classifier track 159 and the label track 169 to generate a first composite track and a second composite track, then subsequently, perform a third operator on the first composite track and the second composite track to generate a new track, which may be a performance track that will be described in more detail below. In the examples shown in FIG. 5, the processor 120 may further generate one or more performance tracks 510 based on combinations of composite tracks 170.

In an example analysis of tracks A and B, a performance of the model 150 depends on an amount of alignments between the displayed blocks of the tracks A and B. Optimally, for each block in A there should exist a block in B of equal length, whose starting point and ending point match the starting and ending points of A. Misclassifications and other prediction-related errors may cause blocks among tracks A or B to be absent or misaligned.

In an example embodiment, quantification of the visual overlap of two or more tracks displayed in the user interface 130 may be based on the Jaccard index, which is defined as the intersection over union of two series of values. If a length of a track is defined as the sum of the duration of all its blocks, the Jaccard index corresponds to the length of the intersection of two tracks (A$\wedge$B) divided by the length of their union (A+B). The processor 120 may determine the Jaccard index to create a performance track 510a indicating an accuracy of the model 150. Similarly, the processor 120 may perform different combinations of operators to extend the Jaccard index quantification in order to generate, for example, a performance track 510b indicating a precision of the model 150, and a performance track 510c indicating recall scores of the model 150.

In an example, the request sent by the user device 102 may include an indication of a type of performance metrics that the user 101 would like to use to evaluate the model 150. The memory 122 may further store a database indicating a set of operators associated with each type of performance metrics, and a sequence to execute the set of operators to generate performance tracks indicating of each performance metrics. For example, the request 106 may indicate a performance metric of "accuracy". The processor 120 may automatically search for "accuracy" in the database stored in the memory 122 to identify a set of operators, such as the intersection operator and the union operator. The processor 120 may also, based on the search, identify a sequence to perform the identified set of operators in order to generate a performance track of the performance metric "accuracy".

Further, the performance tracks 510 may be displayed as including one or more visual attributes to indicate various effects of mispredictions or misclassifications. For example, the performance track 510a indicating an accuracy includes one or more "white", or "unshaded", portions and one or more "shaded" portions. The white portions correspond to the mispredictions affecting the accuracy of the model 150, and the shaded portions correspond to the correct predictions of the model 150. By displaying different visual attributes for different portions of the performance tracks 510, the system 100 provides visual indications of one or more instances of times in which mispredictions occur. The performance tracks 510 may be displayed with other classifier tracks and label tracks simultaneously in the user interface 130. In some examples, the system 100 may perform various commands input by the user 101, such as zoom in to output particular sections of the displayed tracks, zoom out to output additional labels represented by the displayed tracks, shift the displayed tracks horizontally to display different sections (or time ranges) of labels, and/or other commands. In some examples, the system 100 may further output dynamic graphical effects, such as outputting the probability scores (output data 156) and/or the labels in a chronological order to simulate a sequence of events in the environment 152.

Since performance metrics determined by the system 100 are based on the threshold applied to the continuous prediction of a classifiers (e.g., output data 156), the system 100 may further output a receiver operating characteristic (ROC) plot, with its related area under the curve (AUC) score, in the user interface 130 where the AUC is a threshold-independent performance metric. As the threshold changes, a balance of a number of true positives and a number of false negatives may be achieved. Thus, the outputted plot may allow the user 101 to observe how various tracks and performances metrics are updated in response to changes of the threshold being applied to the output data 156.

Figure 6:
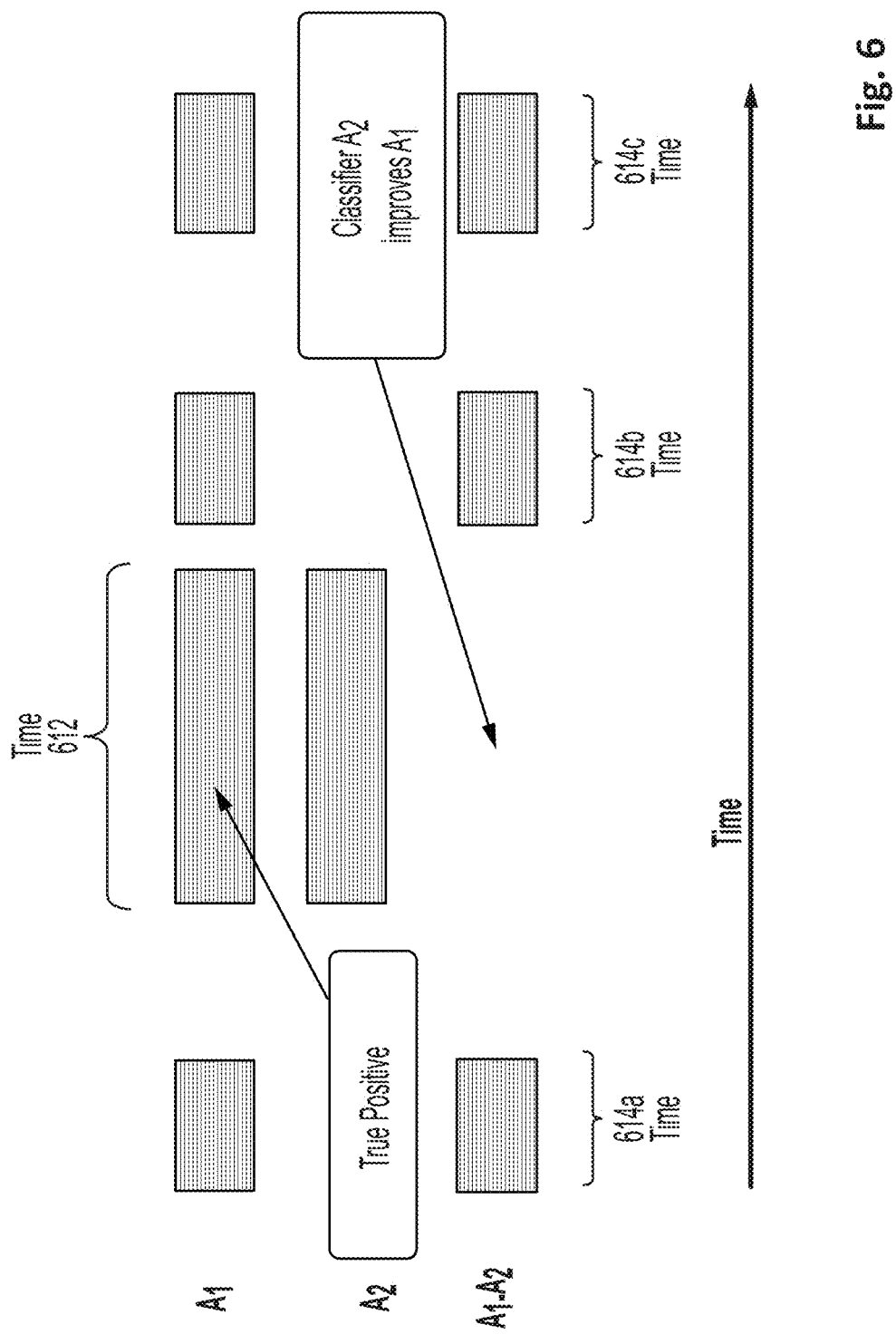
FIG. 6 illustrates example visual indicators, in one embodiment, related to an implementation of interactive visualization evaluation for classification models.

FIG. 6 illustrates example visual indicators, in one embodiment, related to an implementation of interactive visualization evaluation for classification models, arranged in accordance with at least some embodiments presented herein. FIG. 6 may include components that are labeled identically to components of FIGS. 1-5, which will not be described again for the purposes of clarity. The description of FIG. 6 may reference at least some of the components of FIGS. 1-5.

In addition to combining classifier tracks with label tracks, the system 100 may also be implemented to combine different classifier tracks associated with different classification models, or different versions of the same classification model, to perform various analysis. In an example shown in FIG. 6, a track $A_1$ representing predictions from a first classification model and a track $A_2$ representing predictions from a second classification model are shown. The first and second classification models may classify same or different events. The processor 120 may perform the intersection operator, $A_1 \wedge A_2$, to generate a composite track 170 indicating true positive labels spanned among a range of time 512. Similarly, the processor 120 may perform the difference operator $A_1-A_2$ to generate a composite track 170 indicating false positive labels spanned among the times 614*a*, 614*b*, 614*c*. Thus, the comparison and combinations of different tracks associated with different classification models allows the system 100 to provide confirmation on various performances of the classification models, such as identifying true positive labels and false positive labels, and identifying the range of times in which errors may occur.

The system 100 may provide a tool to compare the results of different classification models, and to compare different versions of the same predictive model. By providing a tool to compare results from different versions of a classification model, the system 100 provides results that monitor performances of different versions of the classification model, such that a user of the system 100 may determine appropriate times and situations to update or retrain the classification model.

Figure 7:
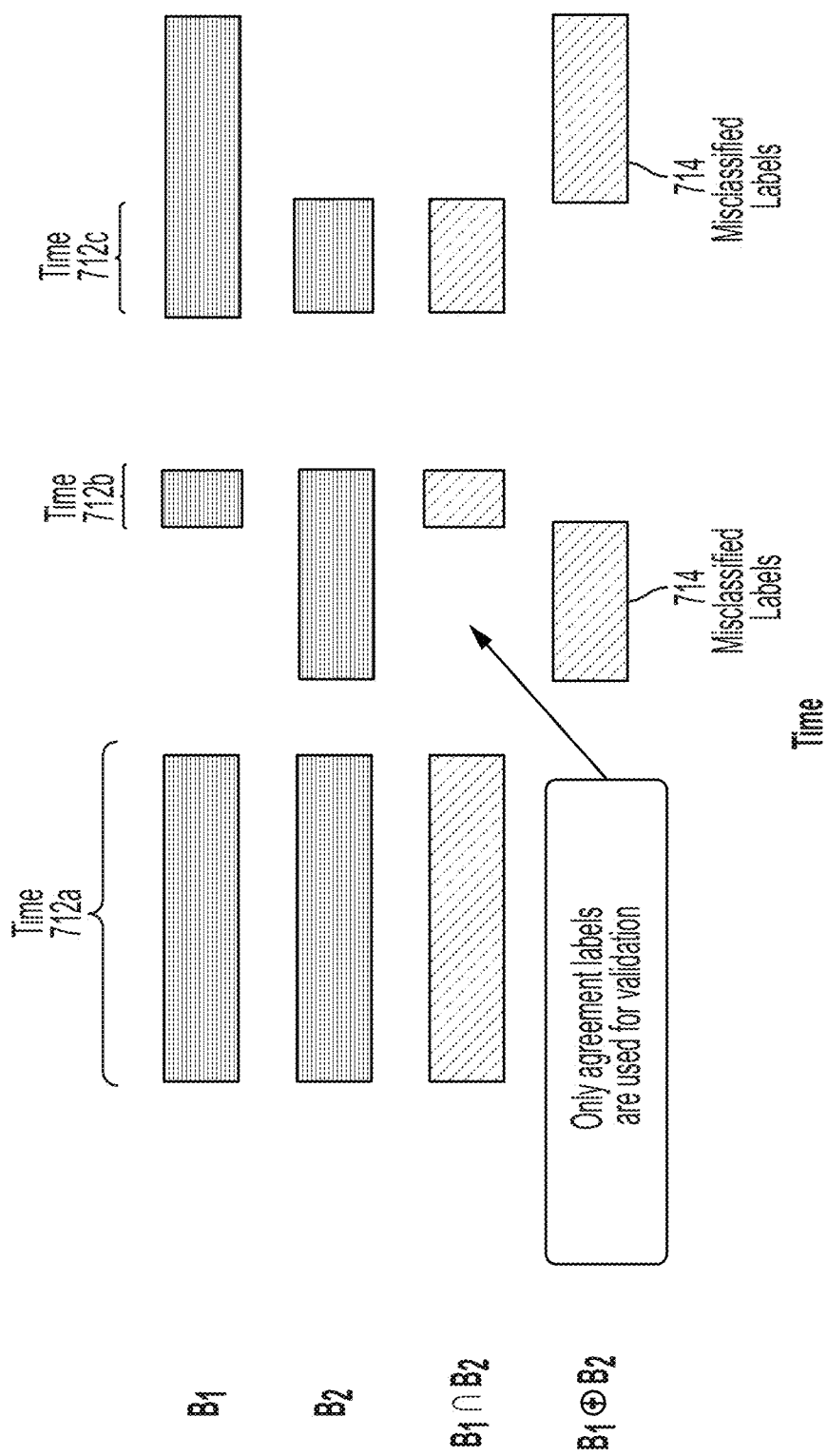
FIG. 7 illustrates example visual indicators, in one embodiment, related to an implementation of interactive visualization evaluation for classification models.

FIG. 7 illustrates example visual indicators, in one embodiment, related to an implementation of interactive visualization evaluation for classification models, arranged in accordance with at least some embodiments presented herein. FIG. 7 may include components that are labeled identically to components of FIGS. 1-6, which will not be described again for the purposes of clarity. The description of FIG. 7 may reference at least some of the components of FIGS. 1-6.

In another example embodiment, the system 100 may also be implemented to combine different label tracks based on different observations. In an example shown in FIG. 7, a track $B_1$ representing a first set of observed labels and a track $B_2$ representing a second set of observed labels are shown. The first and second sets of observed labels may be based on observations of the same environment, or observations of different environments. The processor 120 may perform the intersection operator, $B_1 \wedge B_2$, to generate a composite track 170 indicating true positive observed labels, or agreement labels, spanned among times 712*a*, 712*b*, 712*c*. The processor 120 may further output a recommendation to advise the user 101 to use agreement labels corresponding to times 712*a*, 712*b*, 712*c*, from either label tracks $B_1$ or $B_2$, for analysis of the model 150. Similarly, the processor 120 may perform the XOR operator $B_1 \oplus B_2$ to identify misclassified labels 714. The processor 120 may further remove the misclassified labels 714 from the tracks $B_1$ and $B_2$. Thus, the comparison and combinations of different label tracks associated with different observations allows the system 100 to identify and provide recommendations of an appropriate set of observed labels to be used in analysis of the model 150.

In some examples, human-generated labels may represent a valid source of ground-truth information, but a lack of completeness and correctness may lead to wrong insights and to inaccurate performance estimates. If events within a time period is mislabeled, for instance, it can erroneously reveal a false positive or false negative prediction, thus decreasing the performance of the classification model and affecting the analysis of the cause of mispredictions. Thus, the system 100 provides a tool for users to compare different labels from different observations in order to identify an appropriate set of labels to evaluate classification models. Another challenge relating to human-generated labels may be sporadic absence of labels, either due to distraction of the user performing the observation, or due to an object being our of range from the sensors. The system 100 may provide a solution to absence of labels, by allowing a user to produce a track corresponding to instances in which sensors cannot obtain sensor data (e.g., a track indicating labels of missing instances), and the system 100 may perform various operators on the track indicating absence of labels to account for the missing instances during evaluations of the classification models.

Figure 8:
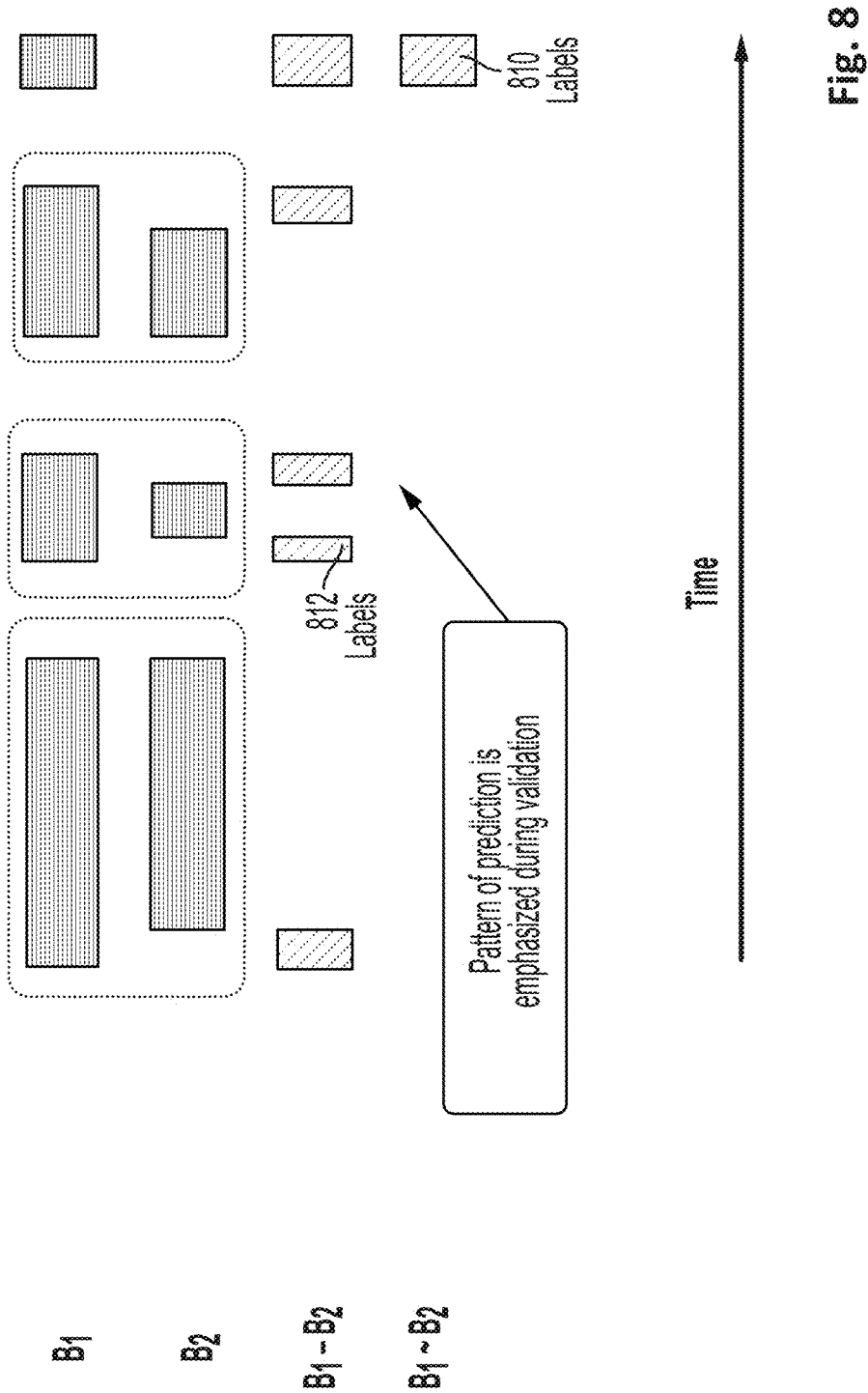
FIG. 8 illustrates example visual indicators, in one embodiment, related to an implementation of interactive visualization evaluation for classification models.

FIG. 8 illustrates example visual indicators, in one embodiment, related to an implementation of interactive visualization evaluation for classification models, arranged in accordance with at least some embodiments presented herein. FIG. 8 may include components that are labeled identically to components of FIGS. 1-7, which will not be described again for the purposes of clarity. The description of FIG. 8 may reference at least some of the components of FIGS. 1-7.

In another example embodiment, the system 100 may be implemented to perform analysis on labels that overlap over time. In some examples, the precise overlap of two tracks may not constitute a fair performance metric. Thus, the tilde operator "~" provides a variation of the subtraction operator that may not be sensitive to the start and end of each pair of labels that are being compared. In the example shown in FIG. 8, the processor 120 may perform the difference operator on label tracks $B_1$ and $B_2$ to identify labels that may be excluded from the analysis of the model 150, where the difference operator is based on a precise matching of the start and end of the blocks of labels among tracks $B_1$ and $B_2$. The processor 120 may also perform the tilde operator to identify only labels that are significantly unaligned, such as the block of labels 810. As shown in the example of FIG. 8, some labels (e.g., labels 812) are not identified as a result of the tilde operator because the tilde operator is does not consider precise matching of the starting time and ending time of a block of labels.

In another example embodiment, the system 100 may also be implemented to combine different tracks to exclude instances where it was not possible to collect ground-truth labels (e.g., observed labels 166). In another example embodiment, the system 100 may also be implemented to combine mutually exclusive labels to exclude events that appear to be unclear.

Figure 9:
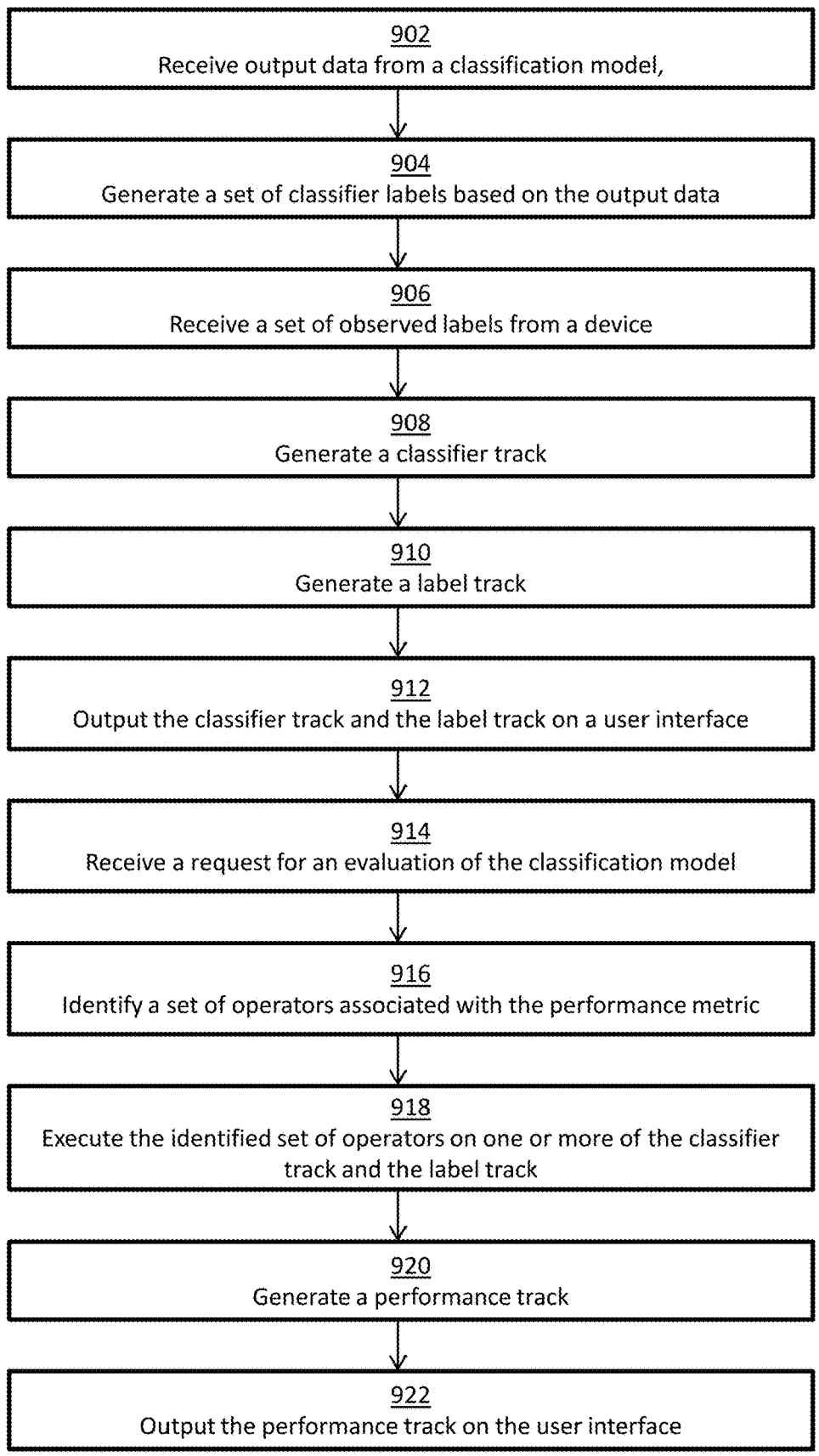
FIG. 9 illustrates a flow diagram relating to a process, in one embodiment, to implement interactive visualization evaluation for classification models.

FIG. 9 illustrates a flow diagram relating to a process, in one embodiment, to implement interactive visualization evaluation for classification models, arranged in accordance with at least some embodiments presented herein. The process in FIG. 9 may be implemented using, for example, computer system 100 discussed above. An example process may include one or more operations, actions, or functions as illustrated by one or more of blocks 902, 904, 906, 908, 910, 912, 914, 916, 918, 920, and/or 922. Although illustrated as discrete blocks, various blocks may be divided into additional blocks, combined into fewer blocks, eliminated, or performed in parallel, depending on the desired implementation.

Processing may begin at block 902, where a processor receives output data from a classification model. The output data comprises a set of probability scores of occurrences of an event within a range of time. Processing may continue from block 902 to block 904. At block 904, the processor generates a set of classifier labels based on the output data. The set of classifier labels is a set of discrete labels representing a portion of the output data. Processing may continue from block 904 to block 906. At block 906, the processor receives a set of observed labels from a device. Each observed label indicates an observed occurrence of the event within the range of times.

Processing may continue from block 906 to block 908. At block 908, the processor generates a classifier track comprising a set of visual indicators representing the set of classifier labels. Processing may continue from block 908 to block 910. At block 910, the processor generates a label track comprising a set of visual indicators representing the set of observed labels. Processing may continue from block 910 to block 912. At block 912, the processor outputs the classifier track and the label track on a user interface. The classifier track and label track are displayed in a layout that aligns the classifier track and the label track.

Processing may continue from block 912 to block 914. At block 914, the processor receives a request for an evaluation of the classification model. The request indicates a performance metric. Processing may continue from block 914 to block 916. At block 916, the processor identifies a set of operators associated with the performance metric. For example, the processor identifies an association between the set of operators and the performance metric from a database stored in a memory. In some examples, the processor also identifies a sequence to execute the identified set of operators. Processing may continue from block 916 to block 918. At block 918, the processor executes the identified set of operators on at least one of the classifier track and the label track. In some examples, the processor also executes the identified set of operators according to the identified sequence. Processing may continue from block 918 to block 920. At block 920, the processor generates a performance track indicating the performance metric of the classification model. Processing may continue from block 920 to block 922. At block 922, the processor outputs the performance track on the user interface to display the performance track, the classifier track, and label track in the layout, such that the performance track is aligned with the classifier track and the label track.

In some examples, the set of observed labels is a first set of observed labels and the label track is a first label track. The processor also generates a second label track comprising visual indicators comprising a set of visual indicators representing a second set of observed labels. The processor also executes an exclusive OR (XOR) operator on the first label track and the second label track. The processor also identifies at least one misclassified labels among the first label track and the second label track based on the execution of the XOR operator. The processor also removes the identified misclassified labels from at least one of the first label track and the second label track.

In some examples, the set of classifier labels is a first set of classifier labels and the classifier track is a first classifier track. The processor also generates a second classifier track comprising a set of visual indicators representing a second set of classifier labels. The processor also executes an intersection operator on the first label track and the second label track. The processor also identifies at least one true positive labels among the first label track and the second label track based on the execution of the intersection operator. The processor also outputs the identified true positive labels as a composite track on the user interface. The true positive labels indicate correct predictions made by the classification model.

Figure 10:
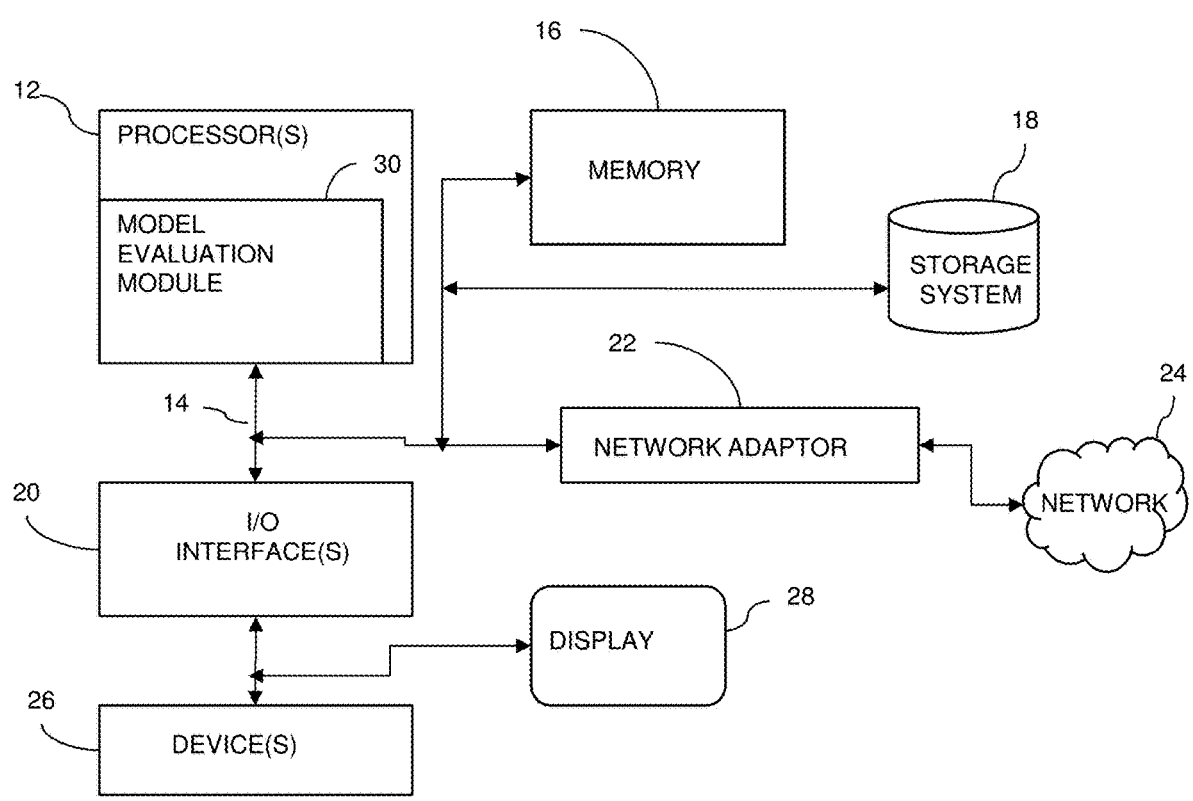
FIG. 10 illustrates a schematic of an example computer or processing system that may implement interactive visualization evaluation for classification models in one embodiment.

FIG. 10 illustrates a schematic of an example computer or processing system that may implement interactive visualization evaluation for classification models in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 10 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, supercomputers, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 (e.g., model evaluation module 30) that performs the methods described herein. The module 30 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 11:
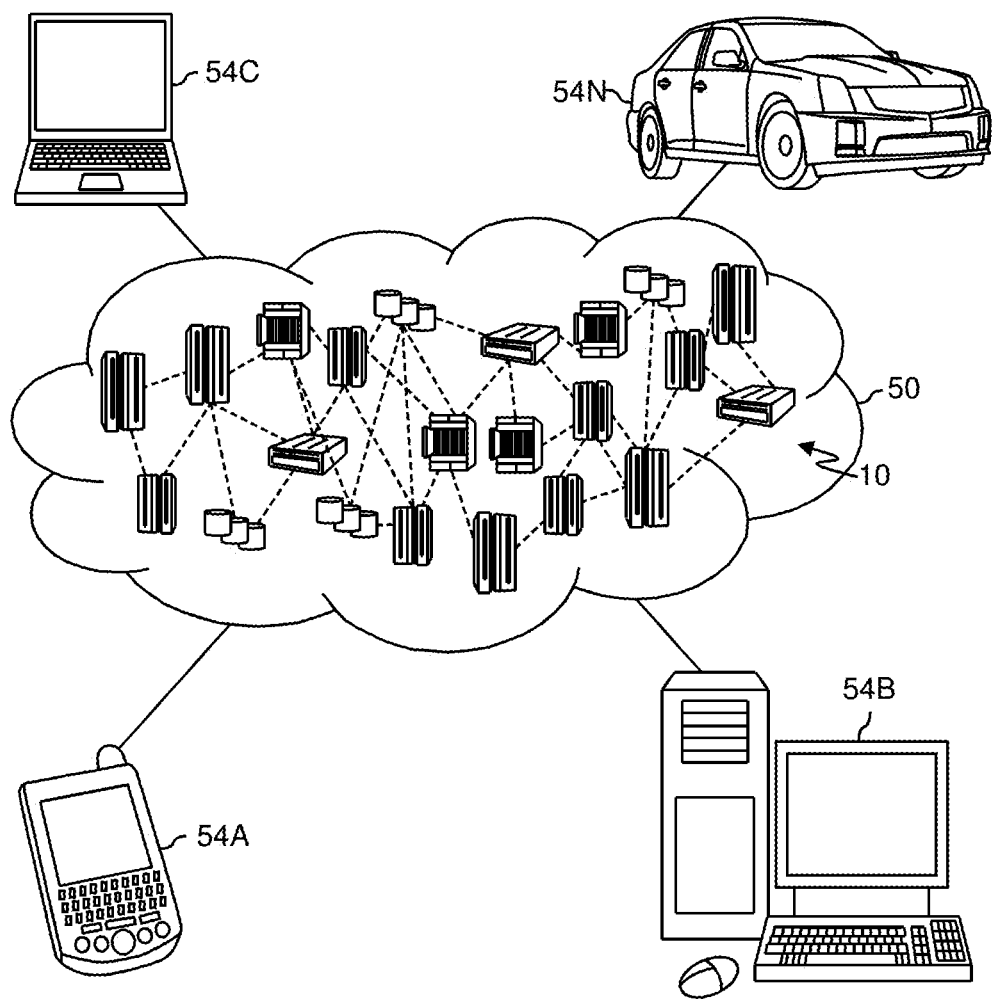
FIG. 11 depicts a cloud computing environment according to an embodiment of the present invention.

FIG. 11 depicts a cloud computing environment according to an embodiment of the present invention. It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 11, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 11 are intended to be illustrative only and that computing nodes 10 and cloud computing environment 50 can communicate with any type of computerized device over any type of network and/or network addressable connection (e.g., using a web browser).

Figure 12:
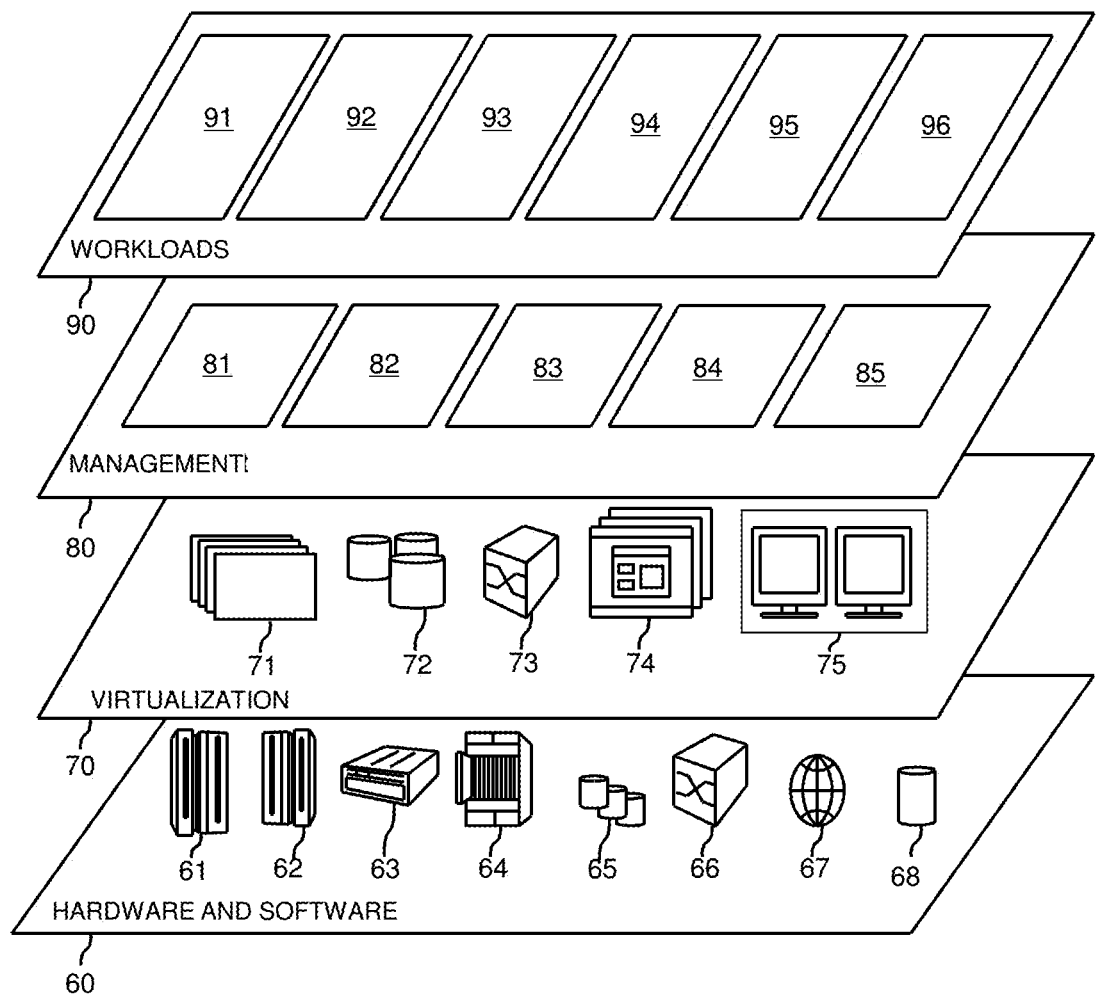
FIG. 12 depicts abstraction model layers according to an embodiment of the present invention.

FIG. 12 depicts abstraction model layers according to an embodiment of the present invention. Referring now to FIG. 12, a set of functional abstraction layers provided by cloud computing environment 50 (FIG. 11) is shown. It should be understood in advance that the components, layers, and functions shown in FIG. 12 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and model evaluation 96.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
receiving, by a processor, output data from a classification model, wherein the output data comprises a set of probability scores of occurrences of an event within a range of time;
generating, by the processor, a set of classifier labels based on the output data, wherein the set of classifier labels is a set of discrete labels representing a portion of the output data;
receiving, by the processor, a set of observed labels from a device, wherein each observed label represents a ground-truth label of the occurrences of the event within the range of times;
generating, by the processor, a classifier track comprising a set of visual indicators representing the set of classifier labels, the set of classifier labels being arranged in the classifier track with respect to time;
generating, by the processor, a label track comprising a set of visual indicators representing the set of observed labels, the set of observed labels being arranged in the label track with respect to time;
outputting, by the processor, the classifier track and the label track on a user interface, wherein the classifier track and label track are displayed in a layout that aligns the classifier track and the label track with respect to time;
receiving, by the processor, a request for an evaluation of the classification model using the set of observed labels, wherein the request indicates a performance metric;
generating, by the processor, another label track comprising another set of visual indicators representing another set of observed labels;
executing, by the processor, an exclusive OR (XOR) operator on the label track and said another label track;
identifying, by the processor, at least one misclassified labels among the label track and said another label track based on the execution of the XOR operator; and
removing, by the processor, the identified misclassified labels from the label track;
identifying, by the processor, a set of logical operators associated with the performance metric;
executing, by the processor, the identified set of logical operators on at least one of the classifier track and the label track with the removed misclassified labels;
generating, by the processor, a performance track indicating the performance metric of the classification model, wherein the performance track is generated based on a result of executing the identified set of logical operators on at least one of the classifier track and the label track with the removed misclassified labels; and
outputting, by the processor, the performance track on the user interface to display the performance track, the classifier track, and label track in the layout, such that the performance track is aligned with the classifier track and the label track.

2. The computer-implemented method of claim 1, wherein generating the set of classifier labels is further based on a threshold of the probability scores.

3. The computer-implemented method of claim 2, further comprising outputting, by the processor, a recommendation to adjust the threshold of the probability scores.

4. The computer-implemented method of claim 1, wherein the set of probability scores is a continuous function that varies with time, and generating the set of classifier labels comprises transforming, by the processor, the continuous function into a set of discrete probability scores at discrete times within the range of times.

5. The computer-implemented method of claim 4, wherein the transforming comprises sampling the probability scores from the continuous function based on a threshold of the probability scores.

6. The computer-implemented method of claim 1, further comprising:
identifying, by the processor, a sequence to execute the identified set of operators; and
wherein executing the identified set of operators comprises executing, by the processor, the identified set of operators according to the identified sequence.

7. The computer-implemented method of claim 1, wherein the set of classifier labels is a first set of classifier labels, and the classifier track is a first classifier track, and the method further comprising:
generating, by the processor, a second classifier track comprising a set of visual indicators representing a second set of classifier labels;
executing, by the processor, an intersection operator on the first classifier track and the second classifier track;
identifying, by the processor, at least one true positive labels among the first classifier track and the second classifier track based on the execution of the intersection operator; and
causing, by the processor, the identified true positive labels to be displayed as a composite track on the user interface, wherein the true positive labels indicate correct predictions made by the classification model.

8. A system comprising:
a memory device configured to store:
output data from a classification model, wherein the output data comprises a set of probability scores of occurrences of an event within a range of time;
a set of observed labels, wherein each observed label represents a ground-truth label of the occurrences of the event within the range of times;
a hardware processor configured to be in communication with the memory device, the hardware processor being configured to:
obtain the output data from the memory device;
generate a set of classifier labels based on the output data, wherein the set of classifier labels is a set of discrete labels representing a portion of the output data;
obtain the set of observed labels from the memory device;
generate a classifier track comprising a set of visual indicators representing the set of classifier labels, the set of classifier labels being arranged in the classifier track with respect to time;
generate a label track comprising a set of visual indicators representing the set of observed labels, the set of observed labels being arranged in the label track with respect to time;
output the classifier track and the label track on a user interface, wherein the classifier track and label track are displayed in a layout that aligns the classifier track and the label track with respect to time;
receive a request for an evaluation of the classification model, wherein the request indicates a performance metric using the set of observed labels;
generate another label track comprising another set of visual indicators representing another set of observed labels;
execute an exclusive OR (XOR) operator on the label track and said another label track;
identify at least one misclassified labels among the label track and said another label track based on the execution of the XOR operator; and
remove the identified misclassified labels from the label track;
identify a set of logical operators associated with the performance metric;
execute the identified set of logical operators on at least one of the classifier track and the label track with the removed misclassified labels;
generate a performance track indicating the performance metric of the classification model, wherein the performance track is generated based on a result of the execution of the identified set of logical operators; and
output the performance track on the user interface to display the performance track, the classifier track, and label track in the layout, such that the performance track is aligned with the classifier track and the label track.

9. The system of claim 8, wherein generation of the set of classifier labels is further based on a threshold of the probability scores.

10. The system of claim 9, wherein the hardware processor is further configured to output a recommendation to adjust the threshold of the probability scores.

11. The system of claim 8, wherein the set of probability scores is a continuous function that varies with time, and generation of the set of classifier labels comprises a transformation of the continuous function into a set of discrete probability scores at discrete times within the range of times.

12. The system of claim 11, wherein the transformation comprises sampling the probability scores from the continuous function based on a threshold of the probability scores.

13. The system of claim 8, wherein the hardware processor is further configured to:
identify a sequence to execute the identified set of operators; and
wherein execution of the identified set of operators comprises an execution of the identified set of operators according to the identified sequence.

14. The system of claim 8, wherein the set of classifier labels is a first set of classifier labels, and the classifier track is a first classifier track, and the hardware processor is further configured to:
generate a second classifier track comprising a set of visual indicators representing a second set of classifier labels;
execute an intersection operator on the first classifier track and the second classifier track;
identify at least one true positive labels among the first classifier track and the second classifier track based on the execution of the intersection operator; and
cause the identified true positive labels to be displayed as a composite track on the user interface, wherein the true positive labels indicate correct predictions made by the classification model.

15. A computer program product of classification model evaluation, the computer program product comprising a computer readable storage medium having program instructions embodied therewith, the program instructions executable by a processing element of a device to cause the device to:

receive output data from a classification model, wherein the output data comprises a set of probability scores of occurrences of an event within a range of time;

generate a set of classifier labels based on the output data, wherein the set of classifier labels is a set of discrete labels representing a portion of the output data;

receive a set of observed labels from a separate device, wherein each observed label represents a ground-truth label of the occurrences of the event within the range of times;

generate a classifier track comprising a set of visual indicators representing the set of classifier labels, the set of classifier labels being arranged in the classifier track with respect to time;

generate a label track comprising a set of visual indicators representing the set of observed labels, the set of observed labels being arranged in the label track with respect to time;

output the classifier track and the label track on a user interface, wherein the classifier track and label track are displayed in an layout that aligns the classifier track and the label track with respect to time;

receive a request for an evaluation of the classification model, wherein the request indicates a performance metric using the set of observed labels;

generate another label track comprising another set of visual indicators representing another set of observed labels;

execute an exclusive OR (XOR) operator on the label track and said another label track;

identify at least one misclassified labels among the label track and said another label track based on the execution of the XOR operator; and remove the identified misclassified labels from the label track;

identify a set of logical operators associated with the performance metric;

execute the identified set of logical operators on at least one of the classifier track and the label track with the removed misclassified labels;

generate a performance track indicating the performance metric of the classification model, wherein the performance track is generated based on a result of executing the identified set of logical operators; and output the performance track on the user interface to display the performance track, the classifier track, and label track in the layout, such that the performance track is aligned with the classifier track and the label track.

16. The computer program product of claim 15, wherein the set of probability scores is a continuous function that varies with time, and the program instructions are further executable by the processing element of the device to cause the device to:

sample the probability scores from the continuous function based on a threshold of the probability scores to generate the set of classifier labels;

based on the performance metric of the classification model, output a recommendation to adjust the threshold of the probability scores.

17. The computer program product of claim 15, wherein the set of classifier labels is a first set of classifier labels, and the classifier track is a first classifier track, and the program instructions are further executable by the processing element of the device to cause the device to:

generate a second classifier track comprising a set of visual indicators representing a second set of classifier labels;

execute an intersection operator on the first classifier track and the second classifier track;

identify at least one true positive labels among the first classifier track and the second classifier track based on the execution of the intersection operator; and cause the identified true positive labels to be displayed as a composite track on the user interface, wherein the true positive labels indicate correct predictions made by the classification model.

* * * * *